United States Patent
Pao et al.

(10) Patent No.: US 11,063,606 B2
(45) Date of Patent: Jul. 13, 2021

(54) SUCCESSIVE CANCELLATION LIST-BASED DECODER AND DECODING METHOD THEREOF

(71) Applicant: National Tsing Hua University, Hsinchu (TW)

(72) Inventors: Yu-Sheng Pao, Hsinchu (TW); Hsin-Yu Lee, Hsinchu (TW); Yeong-Luh Ueng, Hsinchu (TW); Chin-Liang Wang, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 16/823,351

(22) Filed: Mar. 19, 2020

(65) Prior Publication Data

US 2021/0119642 A1 Apr. 22, 2021

(30) Foreign Application Priority Data

Oct. 18, 2019 (TW) ................................. 108137602

(51) Int. Cl.
*H03M 13/11* (2006.01)
*H03M 13/03* (2006.01)
(Continued)

(52) U.S. Cl.
CPC ..... *H03M 13/1105* (2013.01); *H03M 13/036* (2013.01); *H03M 13/098* (2013.01); *H03M 13/13* (2013.01); *H03M 13/2906* (2013.01)

(58) Field of Classification Search
CPC .......... H03M 13/1105; H03M 13/036; H03M 13/098; H03M 13/13; H03M 13/2906
See application file for complete search history.

(56) References Cited

U.S. PATENT DOCUMENTS

| 2016/0013810 A1 | 1/2016 | Gross et al. |
| 2017/0366199 A1 | 12/2017 | Ge et al. |

(Continued)

FOREIGN PATENT DOCUMENTS

| TW | 201902144 | 1/2019 |
| WO | 2017217715 | 12/2017 |
| WO | 2018149416 | 8/2018 |

OTHER PUBLICATIONS

R1-1705757, NTT DOCOMO, "Distributed simple parity check Polar codes," 3GPP TSG RAN WG1 #88bis, Spokane, USA, Apr. 3-7, 2017, pp. 1-6.

(Continued)

*Primary Examiner* — Kyle Vallecillo
(74) *Attorney, Agent, or Firm* — JCIPRNET

(57) ABSTRACT

A successive cancellation list-based decoder and a decoding method thereof are provided. In the method, an error check is performed on a set of data bits. A data unit includes the set of the data bits and at least one first check bit. Part of the set of data bits are considered as at least one second check bit. At each of the second check bits, its previous error-check result are verified, where the verified result is related to a comparison between each of the previous first check bits and a value obtained through a function calculation on corresponding data bits. The verified result at each of the second check bits determines whether to continue decoding of the set of data bits or to early terminate the decoding process. The method is able to increase the probability for early termination of the decoding process and to improve the decoding efficiency.

6 Claims, 5 Drawing Sheets

(51) Int. Cl.
  *H03M 13/09* (2006.01)
  *H03M 13/13* (2006.01)
  *H03M 13/29* (2006.01)

(56) References Cited

U.S. PATENT DOCUMENTS

| | | | | |
|---|---|---|---|---|
| 2018/0097580 | A1* | 4/2018 | Zhang | H04L 1/0063 |
| 2018/0278272 | A1* | 9/2018 | Li | H03M 13/09 |
| 2018/0323809 | A1* | 11/2018 | Lin | H04L 1/0045 |
| 2018/0351695 | A1* | 12/2018 | Yang | H04L 1/0058 |
| 2018/0351696 | A1* | 12/2018 | Yang | H04L 1/0057 |
| 2019/0044540 | A1* | 2/2019 | Jiang | H03M 13/2796 |
| 2019/0052487 | A1* | 2/2019 | Shelby | H04L 1/0072 |
| 2019/0260391 | A1* | 8/2019 | Hui | H04L 1/0045 |
| 2020/0036477 | A1* | 1/2020 | Xu | H04B 7/2668 |
| 2020/0099393 | A1* | 3/2020 | Xu | H03M 13/616 |
| 2020/0119844 | A1* | 4/2020 | Abotabl | H03M 13/09 |
| 2020/0403728 | A1* | 12/2020 | Chen | H04L 1/0071 |
| 2021/0013902 | A1* | 1/2021 | Jang | H04B 1/06 |

OTHER PUBLICATIONS

R1-1709997, Huawei, Hisilicon, "Early termination for Polar code," 3GPP TSG RAN WG1 NR Ad-Hoc#2, Dingdao, China, Jun. 27-30, 2017, pp. 1-9.

R1-1708644, Qualcomm Incorporated, "Early termination for Polar codes," 3GPP TSG-RAN WG1 #89, Hangzhou, P. R. China, May 15-79, 2017, pp. 1-15.

"Office Action of Taiwan Counterpart Application", dated Dec. 9, 2020, p. 1-p. 5.

* cited by examiner

SUCCESSIVE CANCELLATION LIST-BASED DECODER AND DECODING METHOD THEREOF

CROSS-REFERENCE TO RELATED APPLICATION

This application claims the priority benefit of Taiwan application no. 108137602, filed on Oct. 18, 2019. The entirety of the above-mentioned patent application is hereby incorporated by reference herein and made a part of this specification.

TECHNICAL FIELD

The disclosure relates to a decoding technique, and more particularly, to a successive cancellation list (SCL)-based decoder and a decoding method thereof.

BACKGROUND

A polar code has recently been adopted by the 3rd Generation Partnership Project (3GPP) as a control channel coding for uplink and downlink transmission in the Enhanced Mobile Broadband (eMBB) scenario of the 5th Generation (5G) mobile communications. The technical literature of 3GPP states that, in order to reduce the latency of decoding time and a power consumption, an early termination of decoding should be used in a decoding process for the polar code.

In a control signal decoding process, if the decoding process can be early terminated, the decoding latency and the power consumption may both be reduced. In an actual 5G communication system, a parity check code is used in the early termination of decoding for the polar code. In Literature [1] (R1-1705757, NTT DOCOMO, "Distributed simple parity check Polar codes," 3GPP TSG RAN WG1 #88bis, Spokane, USA. 3-7 Apr. 2017, a parity check code for polar code that supports the early termination of decoding is proposed. First of all, data bits are equally divided into P blocks (P is a positive integer greater than zero), and each block is subjected to a parity check coding to generate one parity check bit. An ith parity check bit $pc_i$ may be generated by Equation (1) below:

$$pc_i = \Sigma_{i=0}^{(i+1)K/P} \oplus u_i = u_0 \oplus u_1 \oplus \ldots \oplus u_{(i+1)K/P} \quad (1)$$

wherein it is assumed that there are K data bits and P parity check bits, and $\oplus$ is an operational symbol in a binary addition.

For example, FIG. 1 is an example illustrating a coding configuration. Referring to FIG. 1, it is assumed that P is 3. The size of each block in a coding process is almost equal (i.e., the data is almost equally divided into three blocks). The first parity check bit $pc_0$ is generated by a first data block (the data bits $u_0$ to $u_7$). The second parity check bit $pc_1$ is generated by the first data block and a second data block (the data bits $u_8$ to $u_{15}$). The third parity check bit $pc_2$ is generated by the first to third data blocks (the data bits $u_0$ to $u_7$, the data bits $u_8$ to $u_{15}$ and the data bits $u_{16}$ to $u_{23}$). Each of the parity check bits $pc_0$ to $pc_2$ is related to all the data bits in front of the respective parity check bit. For example, the parity check bit $pc_0$ is generated by performing the binary addition on eight bits (the data bits $u_0$ to $u_7$ in the data block), and the parity check bit $pc_1$ is generated by performing the binary addition on 16 bits (the data bits $u_0$ to $u_7$ in the data block and data bits $u_8$ to $u_{15}$ in the data block).

In order to compare effects in the decoding methods for the early termination, an early termination percentage is defined here as shown in Equation (2) below. It is worth noting that the higher the early termination percentage, the better the effect of the early termination of decoding:

$$Eearly\ termination\ percentage = \frac{Total\ of\ early\ termination\ of\ decoding}{Total\ of\ error\ frames} \quad (2)$$

FIG. 2 is a schematic diagram illustrating a successive cancellation list-based decoding for polar code with assistance of parity check code represented by a binary tree. Referring to FIG. 2, it is assumed that a list size is 4, and $pc_k$ is a kth parity check bit (k is a positive integer). In the decoding process, the data bits $u_{i-2}$, $u_{i-1}$ and $u_i$ are already passed, and a decoder is currently decoding the parity check bit $pc_k$. At this point, the decoder will generate two decoding results. Among two rows of numbers at a lower side of the figure, one row shows the decoding results generated by the SCL-based decoder (i.e., the numbers not marked at the lower side of the figure); the other row shows the decoding results of the parity check code (i.e., the numbers marked with an asterisk "*" in the figure). The four paths at the lower side of the figure are known as survived paths, which are paths filtered by the SCL-based decoder. There are four survived paths when the list size is set to 4. When encountering the parity check bit, the decoder compares the decoding results of the parity check code with the decoding results of the four survived paths. If the decoding results are the same, a parity check verification is passed, or else the parity check verification is not passed. If all the survived paths of the decoder fail to pass the parity check verification, the decoding process is terminated, or else the decoding will continue. In the entire decoding process, all the survived paths are checked at a position of the parity check bit and this verification process is known as a decoding method for the early termination.

However, the decoding method for the early termination proposed in Literature [1] performs the early termination of decoding only at the position of the parity check bit. There is still room for improvement in the early termination of decoding. Furthermore, since the position at which the parity check verification is performed is fixed, the complexity of the early termination of decoding cannot be reduced. Although a chance to achieve the early termination of decoding may be increased by using more of parity check bits, they will result in a lower code rate for the data.

SUMMARY

Accordingly, the embodiments of the disclosure provide a successive cancellation list (SCL)-based decoder and a decoding method thereof, which can increase the chance to achieve the early termination of decoding by adding extra error check bits without increasing the code rate.

The decoding method according to the embodiments of the disclosure is adapted to a successive cancellation list-based decoding, and includes the following steps. An error check is performed on at least one data bit. A data unit includes the data bit and at least one first check bit. One or more data bits are considered as at least one second check bit. Whether the error check is passed is checked at the second check bit. Then, whether to early terminate decoding of the data bit is determined according to a result of the error check on the second check unit. The result of the error check is related to a comparison result between the check bit and a value determined by performing a function calculation on corresponding data bits.

On the other hand, the decoder according to the embodiments of the disclosure is adapted to a successive cancellation list-based decoding, and includes an error checker and an early termination determining circuit. The error checker performs an error check on at least one data bit. A data unit includes the data bit and at least one first check bit. One or more data bits are considered as at least one second check bit. Whether the error check is passed is checked at the second check bit. The early termination determining circuit is coupled to the error checker, and determines whether to early terminate decoding of the data bit according to a result of the error check on the second check unit. The result of the error check is related to a comparison result between the first check bit and a value determined by performing a function calculation on corresponding data bits.

Based on the above, the decoder and the decoding method thereof according to the embodiments of the disclosure can consider a part of all the positions of the data bits as the extra error checking positions so that the decoding may be early terminated before the position of one particular check bit to improve the effect of the early termination of decoding and thereby reduce the decoding complexity.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
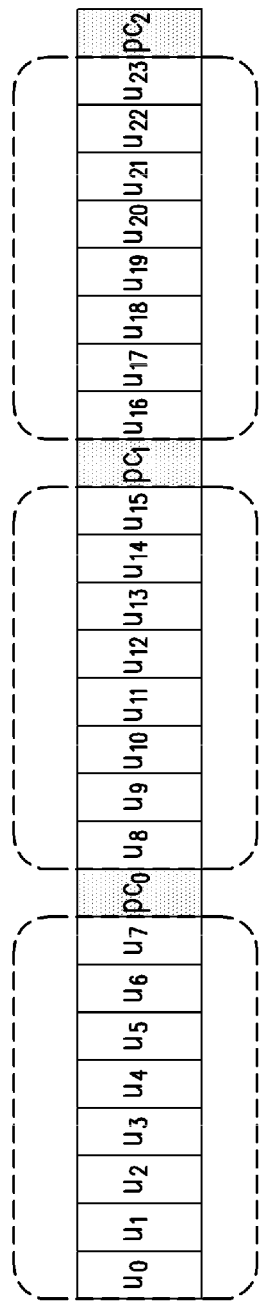
FIG. 1 is an example illustrating a coding configuration.
Figure 2:
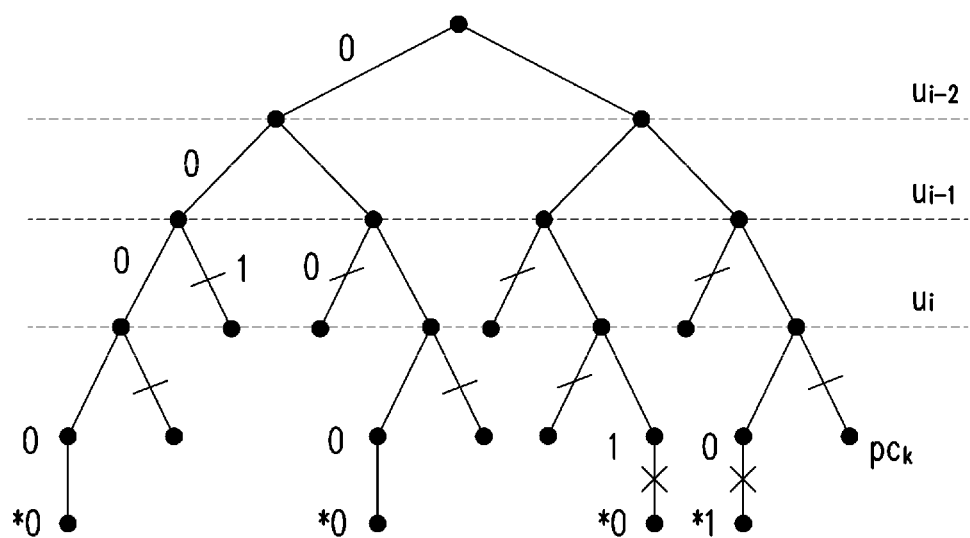
FIG. 2 is a schematic diagram illustrating a successive cancellation list-based decoding for polar code with assistance of parity check code represented by a binary tree.

Reference will now be made in detail to the present preferred embodiments of the disclosure, examples of which are illustrated in the accompanying drawings. Wherever possible, the same reference numbers are used in the drawings and the description to refer to the same or like parts.

Figure 3:
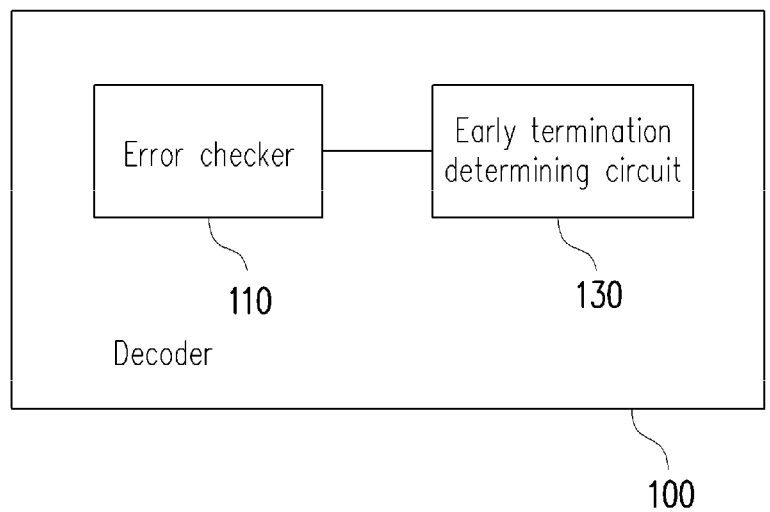
FIG. 3 is a block diagram illustrating elements in a decoder according to an embodiment of the disclosure.

FIG. 3 is a block diagram illustrating elements in a decoder 100 according to an embodiment of the disclosure. Referring to FIG. 3, the decoder 100 includes, but not limited to, an error checker 110 and an early termination determining circuit 130. The decoder 100 is applicable to a communication transceiver in various electronic devices (e.g., a cell phone, a tablet computer or a smart watch).

The error checker 110 and the early termination determining circuit 130 (coupled to the error checker 110) may be digital circuits composed of one or more shifters, adders, registers, and/or multipliers, or may also be processing circuits such as processors, controllers, system on chips (SoCs), or integrated circuits (ICs).

In an embodiment of the embodiment, the error checker 110 is based on an error check scheme for a parity check, which confirms whether the number of values being 1 in binary data is odd or even. However, in other embodiments, the error checker 110 may also adopt the error check scheme like checksum, cyclic redundancy check (CRC) or hash function, which are not particularly limited by the disclosure.

On the other hand, the early termination determining circuit 130 determines whether to terminate the decoding based on a path decision in the successive cancellation list (SCL)-based decoding. For example, the decision may be made by defining a log-likelihood ratio (LLR) value for the next decoding codeword (a likelihood ratio of the probability of transmitting 0 and the probability of transmitting 1 at a transmitting end). When the LLR value is greater than zero, it indicates that the probability of transmitting 0 at the transmitting end is larger; when the LLR value is less than zero, it indicates that the probability of transmitting 1 at the transmitting end is larger; when an absolute value of the LLR value is close to zero, it indicates a channel condition is relatively poor and a wrong determination can easily occur in this case. In an SCL algorithm, a likelihood value of a current codeword is given by a likelihood value of the previous codeword according to a recursive formula. It is assumed that an initial value of a path metric (PM) is 0. When the LLR value calculated by the early termination determining circuit 130 is greater than zero, the path of 0 is not processed, and the LLR value of the path of 1 is accumulated and used as new path metric. When the LLR value calculated by the early termination determining circuit 130 is less than zero, the path of 1 are not processed, and the LLR value of the path of 0 is accumulated and used as new path metric. When a wrong and fixed codeword is selected by the early termination determining circuit 130, the path metric is directly set to a maximum value. It can be seen that a smaller path metric has a higher reliability. The early termination determining circuit 130 starts a path search layer by layer from a root node of a binary decoding tree to a leaf node layer. After each layer is expanded, the early termination determining circuit 130 retains as many subsequent paths as possible (the number of paths retained for each layer is not greater than a preset list length/size L (a positive integer greater than zero)). Further, after the paths of one layer are expanded, the early termination determining circuit 130 selects L path with the smallest PM to be stored in a list, and waits for the expansion of the next layer.

It should be noted that, the decoder 100 may further include a decoding circuit (not shown), and a decoding result of the decoding circuit for the data unit is input to the error checker 110. It is also worth noting that, the decoding circuit may decode the data unit encoded by the polar code, and yet there may be other changes in an encoding type of the data unit.

For better understanding of operating procedures in the embodiments of the disclosure, various embodiments are provided below and served to describe the operating procedures of the decoder 100 in the embodiments of the disclosure. In the following paragraphs, the method according to the embodiments of the disclosure is described with reference to various elements and circuits in the decoder 100.

Each step in this method may be adjusted based on the actual implementation, and the disclosure is not limited thereto.

Figure 4:
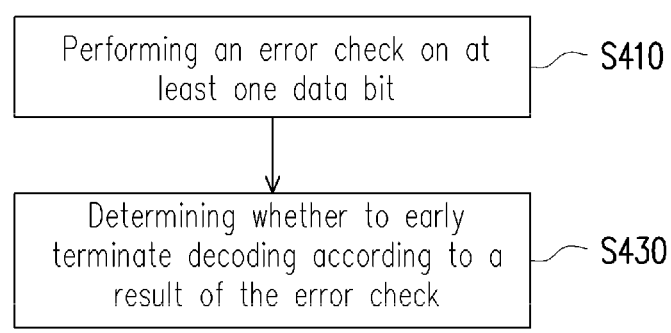
FIG. 4 is a flowchart of a decoding method according to an embodiment of the disclosure.

FIG. 4 is a flowchart of a decoding method according to an embodiment of the disclosure. Referring to FIG. 4, the error checker 110 receives data bits and first check bits of decoded data unit, and performs an error check on one more data bits (S410). Specifically, a decoding method for the early termination adapted to a successive cancellation list-based decoder is proposed according an embodiment of the disclosure. It can be known from the decoding method for the early termination proposed in Literature [1] that the parity check is performed at the parity check bit. In the embodiments of the disclosure, an error check verification may be further performed at specific positions to perform a determination of early termination of decoding. In other words, in the embodiment of the disclosure, extra checking positions for the early termination of the decoding are added in the back of the positions of the first check bits. At the extra checking positions specifically selected for the early termination of decoding, the error check verification is performed on the check bits and the early termination of decoding is performed. In this way, compared to the approach in the Literature [1], a higher chance to achieve the early termination of decoding may be provided.

If the polar code is applied, all the transmitted bits are divided into two sets including a frozen block and a data block. Among them, the bits in the frozen block record known messages (e.g., all 0 or other values), and the bits in the data block may record the data bits, the check bits and the cyclic redundancy check (CRC) bit bits.

Further, due to the characteristics of the successive cancellation list-based decoding, the survived paths retained in the decoding process are sorted and filtered according to reliabilities of the paths. In other words, the paths will be continuously updated, and the path currently passed the error check may not be the survived path after certain data bits are decoded. For instance, there is a successive cancellation list-based decoder for the polar code, which has the list size of four and adopts the parity check code as the decoding method for the early termination. If two of the four survived paths pass the parity check verification performed at one specific parity check bit, the decoding will continue. After multiple data bits are decoded, none of the four survived paths is one of the two paths which passed the parity check verification. In other words, the four survived paths are all split from the paths that did not pass the parity check verification. In this case, this decoding has a high probability of failure, so the early termination determining circuit 130 should determine to early terminate decoding. Nonetheless, in the decoding method for the early termination of Literature [1], the parity check verification is performed and whether to perform the early termination is determined only when proceeding to the position of the next parity check bit.

As described in the foregoing paragraphs, the method proposed by the embodiment of the disclosure is to improve a performance the early termination of decoding by the following two points. Firstly, in the approach proposed by Literature [1], the parity check verification on the paths is only performed at the position of the parity check bit before the early termination of decoding can have a chance of getting started. However, in fact, the determination of the early termination of decoding may be performed at positions of any data bits in the back of a first parity check bit. Therefore, because a time point at which the traditional approach actives the early termination of decoding is relatively late, the effect of the early termination of decoding is reduced. Secondly, the position of the parity check bit is fixed in Literature [1] (e.g., the positions of the check bits are equally distributed in the back of the three blocks as described in BACKGROUND section). As an experiment result, probabilities to achieve the early termination of decoding at the positions of the three parity check bits are not particularly high. In other words, there is a higher probability of starting the early termination of decoding when the early termination of decoding is determined at other data bits.

Based on the two points described above, in the embodiment of the disclosure, the effect of the early termination of decoding can be improved by adding the extra checking positions for the early termination of the decoding. In an embodiment, the data unit received by the decoder 100 includes one or more data bits (e.g., a set of data bits) and one or more first check bits. The data bits are used to record various data or information. The first check bits are used to record a value determined by performing a specific function calculation on the data bits based on an error check method (e.g., the check bit of the parity check is a function for recording whether the number of the corresponding data bits being 1 is odd or even (exclusive-OR (XOR) function) and the other functions may be hash, sum or the like). That is, the data bit is not the first check bit. It should be noted that, the error checker 110 selects a part or all the data bits in the data unit as second check bits. Here, the second check bits are not used to record that the value determined by performing the specific function calculation on the data bits, but used by the error checker 110 to check whether the error check is passed at the second check bits (i.e., the extra checking positions for the early termination of decoding). However, the second data bits are still used to record various data or information. On the other hand, the error checker 110 does not check whether the error check is passed at positions of those not considered as the second check bits in the data.

It should be noted, a result of the error check is related to a comparison result between the check bit and a value determined by performing a function calculation (based on a specific error check scheme) on corresponding data bits. The comparison result may be that the two are the same (i.e., matched and passed) or the two are different (i.e., mismatched and not passed). For example, if a result of an XOR operation performed on the data bit is 1 and a decoded value of a subsequent parity check bit is 1, the error checker 110 determines that the error check is passed; otherwise, the error check is not passed.

If the data still uses the same position of the parity check bit in Literature [1] (e.g., the data is divided into multiple blocks and the position in the back of each block is used as the check bit), a simple way to add the extra checking positions is to: in addition to all the first check bits, set all the data bits in the back of the position of the first one of first check bits as the check bits for the early termination of decoding (i.e., the second check bits). In other words, after the position of the first one of the first check bits is passed, in each decoding for the data bit, the error check verification is performed and the determination of the early termination of decoding is performed. Under such circumstance, because the determination is performed at all possible positions of the bits where the early termination of decoding may occur, the probability of early termination of decoding can be greatly increased, and the decoding can be early terminated at the earliest time.

However, if the determination of the early termination of decoding is performed at all the possible positions of the bits where the early termination of decoding may occur, a large number of calculations are required and a decoding complexity is increased. Experimental results show that the early termination of decoding will not be triggered at the positions of most of the data bits. In other words, because events of the early termination of decoding occurring at these positions are rare, it is inefficient to consider all the data bits as the second check bits. In order to select effective extra checking positions for the early termination of decoding, an embodiment of the disclosure performs an analysis computation for reliabilities of the positions of the second check bits, and accordingly finds out a relationship between the extra checking positions for the early termination of decoding and the events of the early termination of decoding. The experimental results show that the probability of the early termination of decoding occurring at the data bit with lower reliability is higher, and the early termination of decoding is less likely to occur at the data bit with higher reliability. The experimental results suggest that, by setting the positions of bits among the data bits with lower reliability as the extra checking positions for the early termination of decoding (i.e., the second check bits), the early termination of decoding may be performed effectively.

In order to find the extra checking positions for the early termination of decoding with lower reliability to be used as effective checking points for the early termination of decoding, the error checker 110 can select a part of the data bits in the data unit as the second check bits according to chances of all the data bits in the data unit to achieve the early termination. In the embodiments of the disclosure, different selecting methods, including Bhattacharyya and polarization weight methods, may be adopted to calculate a probability at which an early termination event occurs for each of the data bits.

In an embodiment, the polarization weight method is adopted to select the extra checking positions for the early termination of decoding so as to improve the performance of the early termination of decoding since the polarization weight method is independent of a channel signal-to-noise ratio (SNR), there is no need to consider channel conditions. In addition, by adding more of the extra checking positions for the early termination of decoding, the performance of the early termination of decoding can be closer to the performance of the early termination of decoding using all the possible extra checking positions. By selecting an appropriate amount of extra checking positions for the early termination of decoding according to the embodiment of the disclosure, the performance of the early termination of decoding may be improved.

For instance, if the data has a code length of 256 bits and a code rate of 0.5, Table (1) and Table (2) list a comparison between different selecting methods for the extra checking points and the approach of Literature [1].

TABLE (1)

|  | Second check bits are not used | Second check bits are selected using polarization weight | All data bits are considered as second check bits |
|---|---|---|---|
| The number of effective checking positions | 3 | 10 + 3 | 73 + 3 |

TABLE (2)

| SNR (dB) | Second check bits are selected using polarization weight | All data bits are considered as second check bits |
|---|---|---|
| 0.5 | 42.2% | 43.3% |
| 1.5 | 36.4% | 37.2% |
| 2.5 | 29.7% | 30.1% |

In Literature [1], three parity check bits are used, and their positions are respectively positions of the 37th, 74th and 111th bits in a data sequence. Since the three parity check bits also trigger the early termination of decoding, three are added to the number of the second check bits, and a sum between the two numbers is the number of effective checking positions. From Table (1), it can be concluded that if all the data bits are considered as the second check bits, there will be a total of 76 effective checking positions. 10 checking positions can be selected using the polarization weight, and there will be a total of 13 effective checking positions.

On the other hand, from Table (2), early termination percentages utilizing the different selection methods for the extra checking points can be derived. As shown in Table (2), when SNR is 0.5 db, the early termination percentage of the method using all the data bits is only 1.1% higher than that of the method using the polarization weight. In higher SNR environments (1.5 dB and 2.5 dB), the early termination percentage of the method using all the data bits is approximately 1% higher than that of the selection method using the polarization weight. Such a result shows that the method proposed by the embodiment of the disclosure can use the polarization weight to select a limited number of effective extra checking point positions (i.e., the second check bits), and can achieve better effect of the early termination of decoding simply by increasing a computational complexity for a small number of bits.

Referring back to FIG. 4, based on the aforementioned configuration of the second check bits, the early termination determining circuit 130 can determine whether to early terminate decoding of the data bits in the data according to a result of the error check on the second check bits (step S430). Specifically, after one specific data bit is decoded by the decoder 100, if that specific data bit is the second check bit, the error checker 110 then performs the error check verification. In an embodiment, the error checker 110 determines whether one or more previously checked first check bits match the value determined by performing the function calculation on the corresponding data bits at the second check bit. If the previously checked first check bits match the value determined by performing the function calculation on the corresponding data bits (i.e., the previous error-check results are verified) at the second check bit in any of the survived paths, the decoder 100 continues decoding of the rest of the data bits. On the other hand, if the previously checked first check bits mismatch the value determined by performing the function calculation on the corresponding data bits (i.e., the error check verification is not passed or not verified) at the second check bit in all of the survived paths, the early termination determining circuit 130 can terminate decoding of the rest of the data bits.

In order to evaluate the effect of a mechanism for the early termination of decoding on the SCL-based decoder, further analysis can be performed on the number of frames that are early terminated. The computational complexity estimation method proposed in Literature [2] (R1-1709997, Huawei, HiSilicon, "Early termination for Polar code," 3GPP TSG RAN WG1 NR Ad-Hoc #2, Qingdao, China, 27-30 Jun.

2017) may be used to calculate a number of calculations saved by the proposed mechanism for the early termination of decoding. According to Literature [2], a computational complexity ratio of the data block and the frozen block is set to 4:1. In other words, the decoding complexity of one data block is equivalent to the decoding complexity of four frozen blocks. Under the same number of error frames, the numbers of calculations under the different mechanisms for the early termination of decoding are calculated. Taking the code length of 1024 and the code rate of 0.5 as an example, if the early termination of decoding is not triggered in the decoding process, there will be 512 bits in the frozen block and 512 bits in the data block in total, and the number of calculations is calculated as 512+512*4=2560 computation units. In this way, when different SNRs are counted, the number of calculations required for 100 sets of the error frames is accumulated, and a ratio between a difference from the total number of the calculations and an original number of calculations is used as a gain percentage. Taking SNR 0.5 dB as an example: the number of calculations of the traditional early termination of decoding is 107826 calculation units, an accumulated number of calculations of the proposed method for the early termination of decoding is 92829 calculation units, and a method for calculating the gain of the early termination of decoding is (107826−92829)/107826=13.909%.

Compared with the decoding method for the early termination in Literature [1], the method proposed by the embodiments of the disclosure can further reduce the number of decoding calculations. Referring to the Table (3) below, as can be found in the mechanism for the early termination of decoding proposed by the embodiment of the disclosure, in the case of the code length of 1024, the code rate of 0.5 and the list size of 8, the number of calculations is reduced by 13% to 16% compared to the decoding method for the early termination in Literature [1] of the conventional art.

TABLE (3)

| SNR | Degree of complexity reduction |
|---|---|
| 0.0(dB) | 16.312% |
| 0.5(dB) | 13.909% |
| 1.0(dB) | 13.182% |
| 1.5(dB) | 15.307% |
| 2.0(dB) | 15.260% |

In order to assist the reader in understanding the spirit of the embodiments of the disclosure, three examples are further provided below. These examples provide a brief explain using the binary tree. Other than the positions of the parity check bits, a part of the data bits are selected as the second check bits to perform the determination of the early termination of decoding in the following embodiments of the disclosure. First of all, it is assumed that a list length is 4, and the decoder 100 has completed decoding of the data bits $u_0$, $u_1$ and has completed decoding of the parity check bits $u_2$, $pc_0$ and $pc_1$. It should be noted that, the data bits $u_3$ and $u_4$ are not only the data bits but also the extra checking positions for the early termination of decoding (i.e., the second check bits).

Figure 5:
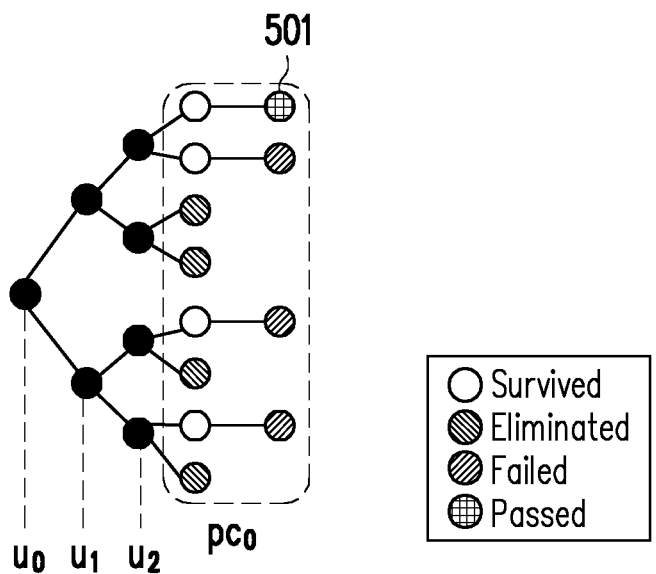
FIG. 5 is an example illustrating a determination of the early termination of decoding.

FIG. 5 is an example illustrating a determination of the early termination of decoding. Referring to FIG. 5, the error checker 110 performs the parity check verification on the paths at the position of the first parity check bit $pc_0$. Because of the fact that at least one path 501 (i.e., the survived path) passes the parity check verification, the decoding will continue. The early termination determining circuit 130 performs a path deletion on each of dashed blocks in the binary tree. When encountering the parity check bit, the error checker 110 performs a path selection and performs the parity check verification on the survived paths. When encountering the second check bit, the error checker 110 performs the path selection and performs the parity check verification on all the previously checked parity check bits at the second check bit. After the paths are split, since the list size is set to four, the early termination determining circuit 130 will select four of the eight paths as the survived paths. When encountering the second check bit, the error checker 110 performs the parity check verification on all the survived paths. Under the condition that at least one of the survival paths passes the verification, the early termination determining circuit 130 will determine that the decoding can continue.

Figure 6:
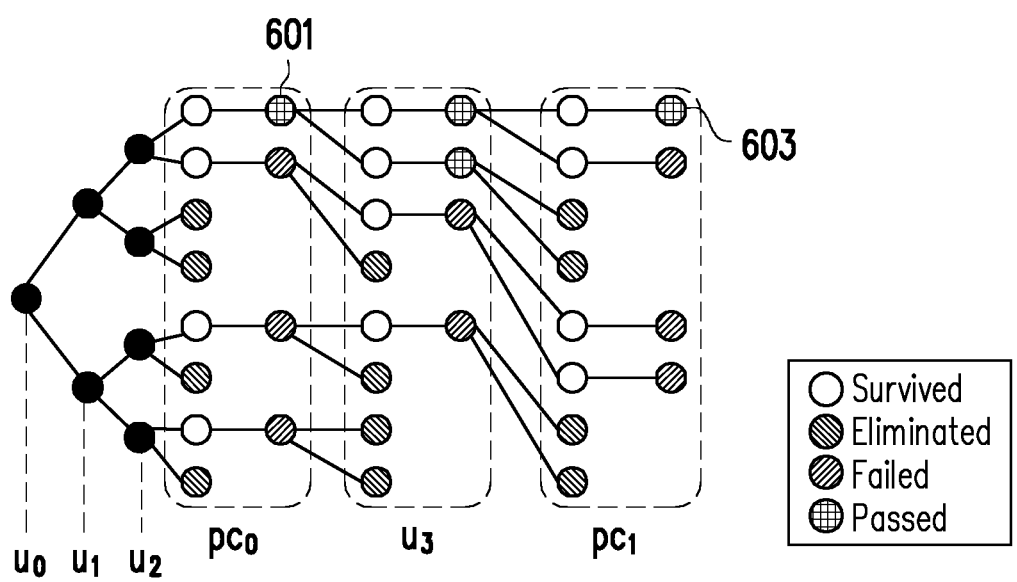
FIG. 6 is another example illustrating a determination of the early termination of decoding.

FIG. 6 is another example illustrating a determination of the early termination of decoding. Referring to FIG. 6, a path passes a parity check verification at the first parity check bit $pc_0$ (corresponding to a path 601) and the decoding is currently being performed at a second parity check bit $pc_1$. Since one path 603 in the survived paths passes the parity check verification, the early termination determining circuit 130 determines that the decoding can continue.

Figure 7:
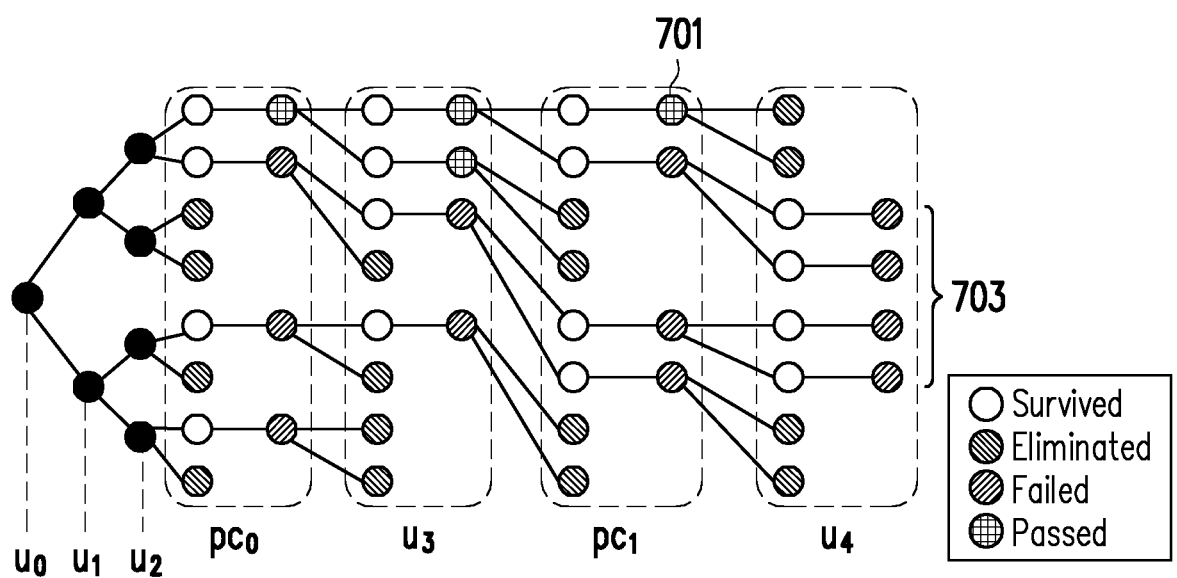
FIG. 7 is yet another example illustrating a determination of the early termination of decoding.

FIG. 7 is yet another example illustrating a determination of the early termination of decoding. Referring to FIG. 7, the decoder 100 starts decoding by considering the data bit $u_4$ as the second check bit. As can be seen from the figure, after a sorting phase, four survived paths 703 are all split from paths that did not pass the parity check verification (only a path 701 can pass the verification). At the time, the early termination determining circuit 130 determines to early terminate decoding at the data bit $u_4$. The early termination determining circuit 130 checks whether the fourth paths pass the parity check verification at the parity check bits $pc_0$ and $pc_1$ in front of the data bit $u_4$. If the fourth paths do not pass the parity check verification at one bit of the parity check bits $pc_0$ or $pc_1$, the early termination determining circuit 130 then determines to early terminate decoding. That is, the decoder 100 does not decode the rest of the data bits.

The above process illustrates that the embodiment of the disclosure can perform the error check verification by setting the extra checking positions for the early termination of decoding (i.e., the second check bits, such as the data bits $u_3$ and $u_4$ in FIG. 7) and can perform the early termination of decoding according to a checking result.

In summary, in addition to the determination of the early termination of decoding performed at the positions of the check bits for the error check, the successive cancellation list-based decoder and the decoding method thereof according to the embodiments of the disclosure can also set the extra checking positions for the early termination of decoding at the specific data bits (i.e., the second checking bits) and perform the determination of the early termination of decoding. In addition, the effect of architecture of the early termination of decoding according to the embodiments of the disclosure is better than the conventional architecture, the decoding may be early terminated in an earlier decoding stage, and the power consumption may be reduced in hardware implementation.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A decoding method, adapted to a successive cancellation list (SCL)-based decoding, the decoding method comprising:

providing a data unit, wherein the data unit comprises a plurality of data bits and at least one first check bit; determine a change of each of the plurality of data bits in the data unit to achieve an early termination through Bhattacharyya or polarization weight;

selecting a second check bit from the plurality of data bits in the data unit according to the changes of all the plurality of data bits in the data unit to achieve the early termination;

in response to the second check bit being selected, performing an error check on the second check bit, wherein whether the error check is passed is checked at the second check bit; and determining whether to early terminate decoding of the plurality of data bits according to a result of the error check at the second check bit, wherein the result of the error check is related to a comparison result between the at least one first check bit and a value determined by performing a function calculation on corresponding data bits.

2. The decoding method according to claim 1, wherein the step of determining whether to early terminate decoding of the at least one plurality of data bits according to the result of the error check on the at least one second check bit comprises:

in response to at least one previously checked first check bit mismatching the value determined by performing the function calculation on the corresponding data bits at one of the at least one second check bit, terminating decoding of the at least one plurality of data bits; and in response to at least one previously checked first check bit matching the value determined by performing the function calculation on the corresponding data bits at one of the at least one second check bit, continuing decoding of the rest of the at least one plurality of data bits.

3. The decoding method according to claim 1, wherein the error check is based on a parity check.

4. A decoder adapted to a successive cancellation list-based decoding on a data unit, the decoder comprising:

an error checker, determining a change of each of a plurality of data bits in the data unit, which further comprises at least one first check bit, to achieve an early termination through Bhattacharyya or polarization weight, selecting a second check bit from the plurality of data bits in the data unit according to the changes of all the plurality of data bits in the data unit to achieve the early termination, and performing an error check on the second check bit in response to the second check bit being selected, wherein whether the error check is passed is checked at the second check bit; and an early termination determining circuit, coupled to the error checker, and determining whether to early terminate decoding of the plurality of data bits according to a result of the error check at the second check bit, wherein the result of the error check is related to a comparison result between the at least one first check bit and a value determined by performing a function calculation on corresponding data bits.

5. The decoder according to claim 4, wherein in response to at least one previously checked first check bit mismatching the value determined by performing the function calculation on the corresponding data bits at one of the second check bit, the early termination determining circuit terminates decoding of the plurality of data bits; and in response to at least one previously checked first check bit matching the value determined by performing the function calculation on the corresponding data bits at one of the second check bit, the decoder continues decoding of the rest of the plurality of data bits.

6. The decoder according to claim 4, wherein the error check is based on a parity check.

* * * * *